(12) United States Patent
Yoshikawa et al.

(10) Patent No.: US 9,698,338 B2
(45) Date of Patent: Jul. 4, 2017

(54) MAGNETIC MEMORY DEVICE AND METHOD OF MANUFACTURING MAGNETIC MEMORY DEVICE

(71) Applicants: Masatoshi Yoshikawa, Seoul (KR); Satoshi Seto, Seoul (KR); Shuichi Tsubata, Seoul (KR); Kazuhiro Tomioka, Seoul (KR)

(72) Inventors: Masatoshi Yoshikawa, Seoul (KR); Satoshi Seto, Seoul (KR); Shuichi Tsubata, Seoul (KR); Kazuhiro Tomioka, Seoul (KR)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 62 days.

(21) Appl. No.: 14/639,675

(22) Filed: Mar. 5, 2015

(65) Prior Publication Data
US 2016/0079519 A1    Mar. 17, 2016

Related U.S. Application Data

(60) Provisional application No. 62/049,097, filed on Sep. 11, 2014.

(51) Int. Cl.
| H01L 27/22 | (2006.01) |
| H01L 21/00 | (2006.01) |
| H01L 43/08 | (2006.01) |
| H01L 43/12 | (2006.01) |

(52) U.S. Cl.
CPC .......... *H01L 43/08* (2013.01); *H01L 27/224* (2013.01); *H01L 43/12* (2013.01); *H01L 27/228* (2013.01)

(58) Field of Classification Search
CPC .................................................. H01L 27/224
USPC .............................. 257/422, 427; 438/61, 74
See application file for complete search history.

(56) References Cited

U.S. PATENT DOCUMENTS

| 7,645,618 B2* | 1/2010 | Ditizio ................. H01L 43/12 257/71 |
| 8,710,605 B2* | 4/2014 | Takahashi ............ H01L 27/228 257/421 |
| 8,829,580 B2* | 9/2014 | Sugiura ............... H01L 27/228 257/295 |
| 8,884,389 B2* | 11/2014 | Toko .................... H01L 43/08 257/425 |
| 8,994,131 B2* | 3/2015 | Shimomura ......... G11C 11/161 257/421 |
| 9,117,924 B2* | 8/2015 | Kitagawa ............. H01L 29/82 257/421 |
| 9,117,995 B2* | 8/2015 | Daibou ................ H01L 43/08 27/222 |

(Continued)

FOREIGN PATENT DOCUMENTS

JP    2013197524 A    9/2013

*Primary Examiner* — Calvin Lee
(74) *Attorney, Agent, or Firm* — Holtz, Holtz & Volek PC

(57) ABSTRACT

According to one embodiment, a method of manufacturing a magnetic memory device includes a stack structure formed of a plurality of layers including a magnetic layer, the method includes forming a lower structure film including at least one layer, etching the lower structure film to form a lower structure of the stack structure, forming an upper structure film including at least one layer on a region including the lower structure, and etching the upper structure film to form an upper structure of the stack structure on the lower structure.

12 Claims, 19 Drawing Sheets

(56) References Cited

U.S. PATENT DOCUMENTS

2013/0248355 A1 9/2013 Ohsawa et al.
2014/0021426 A1 1/2014 Lee et al.

* cited by examiner

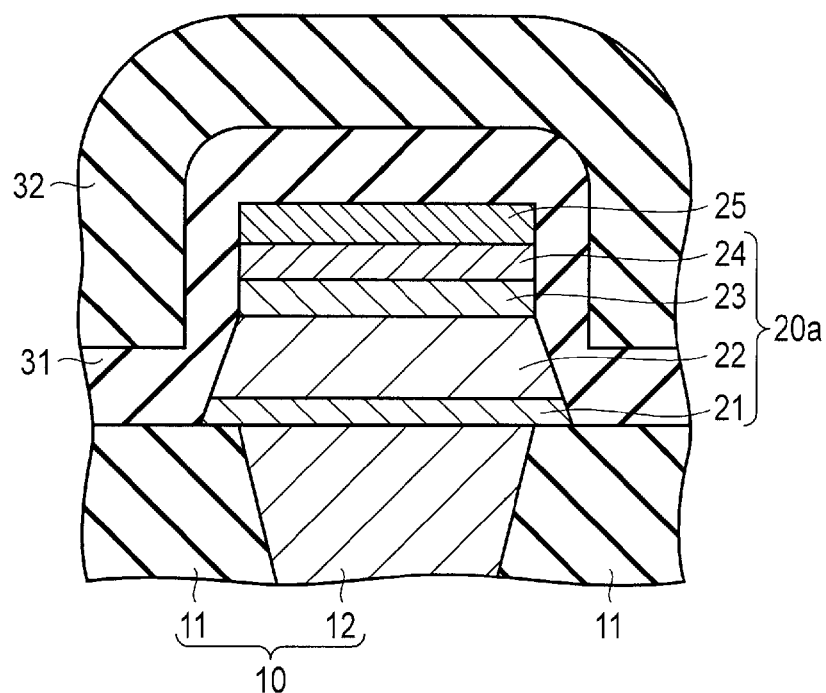
F I G. 3
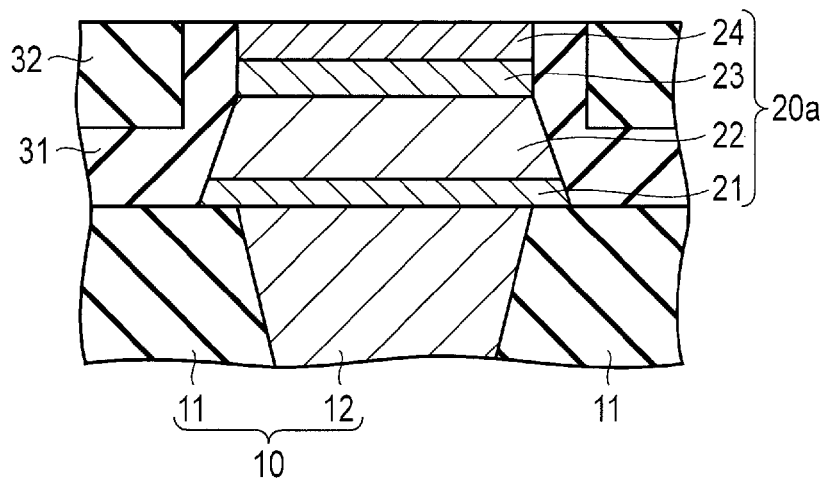
F I G. 4

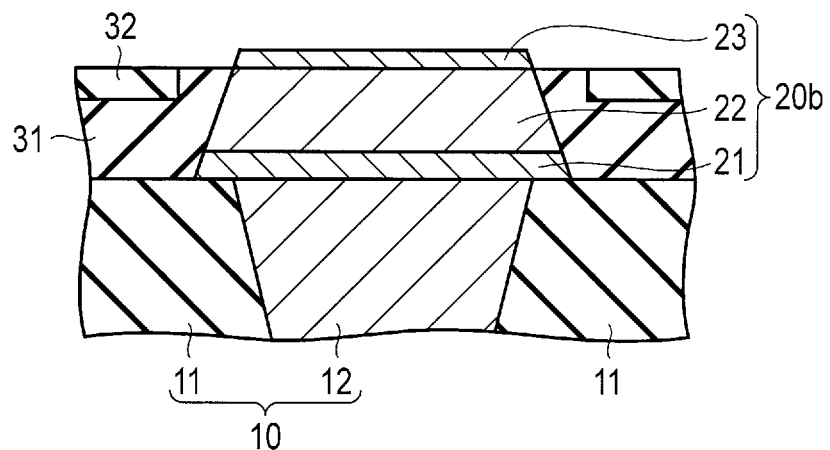
F I G. 5
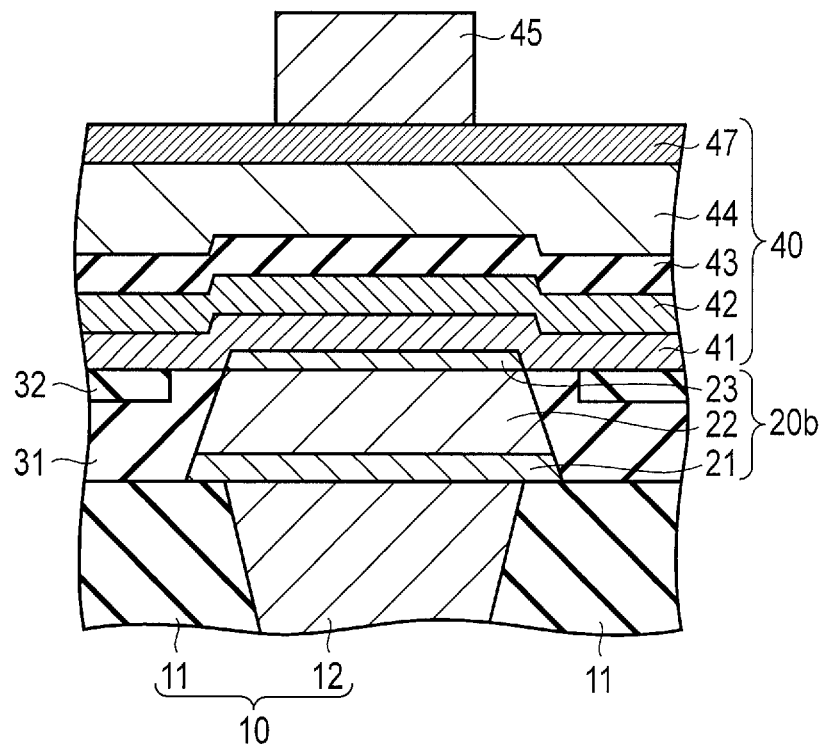
F I G. 6

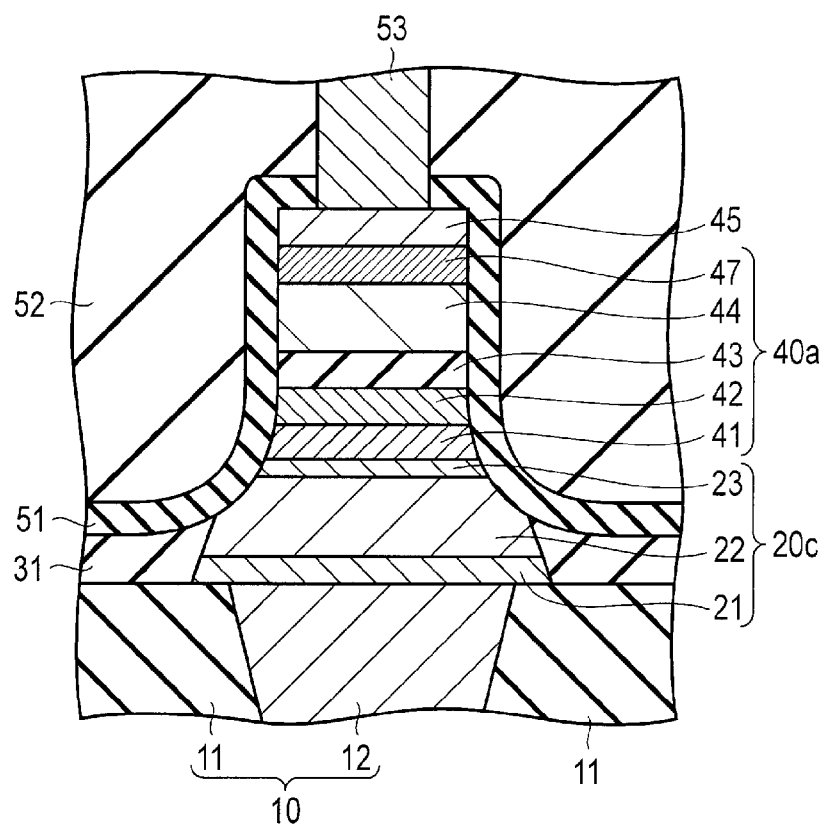
F I G. 9
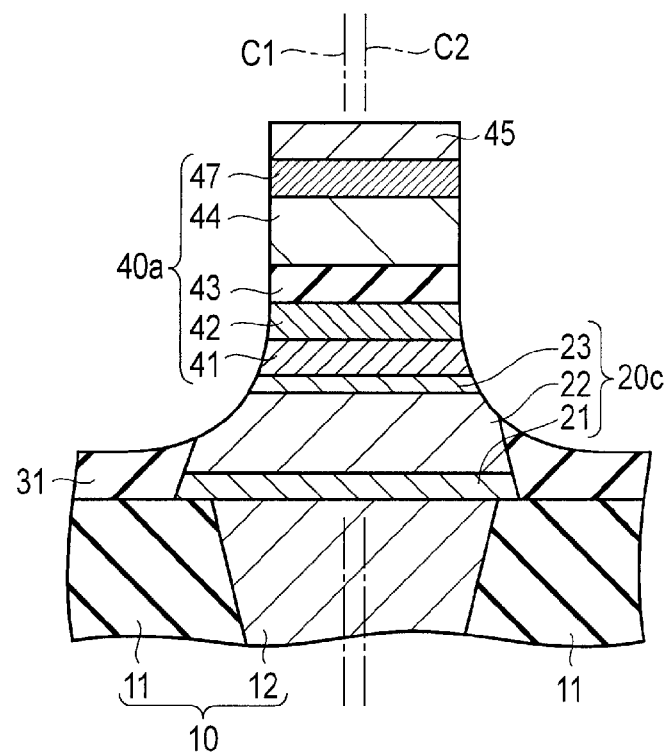
F I G. 10

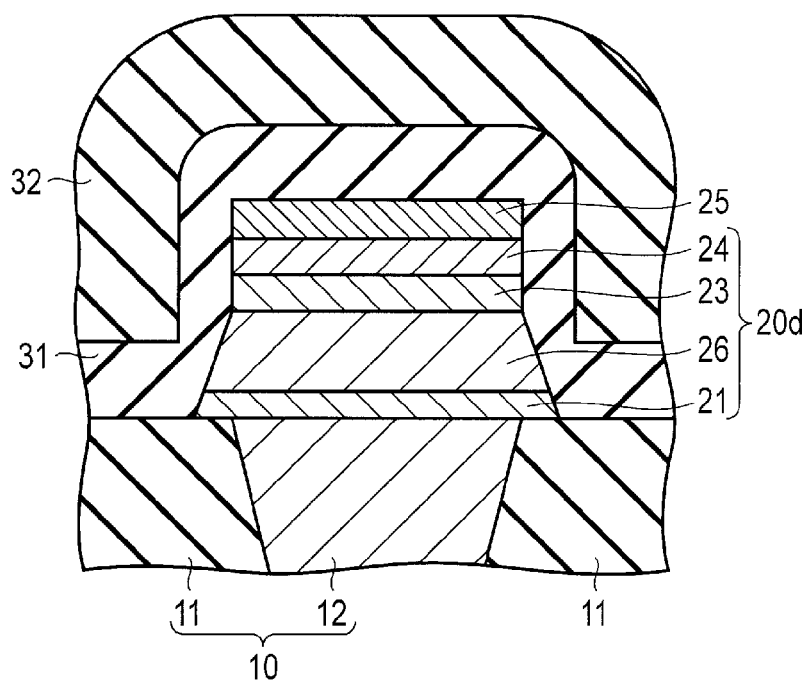
F I G. 16
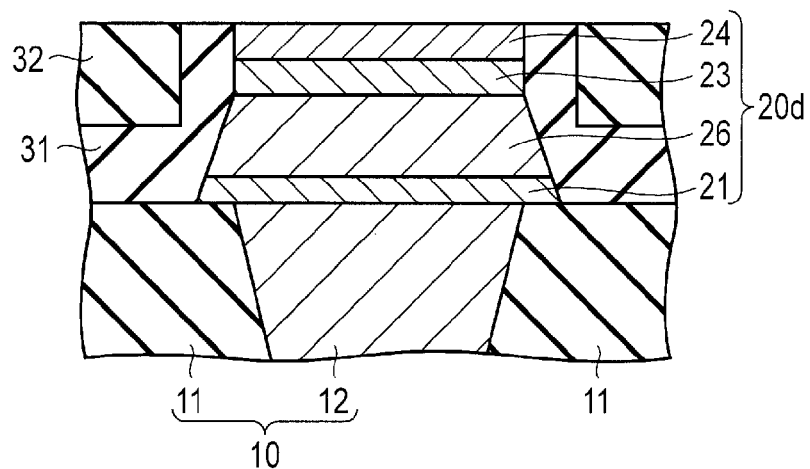
F I G. 17

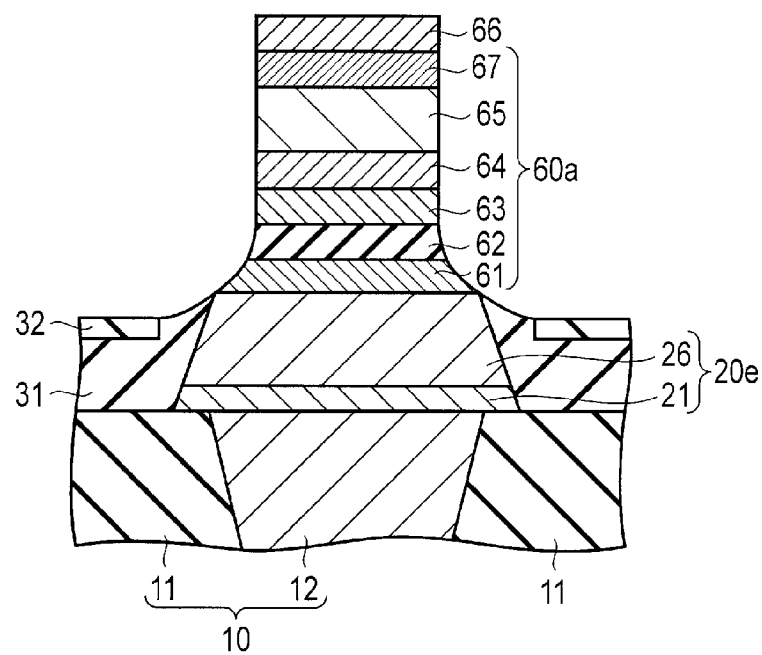
F I G. 20
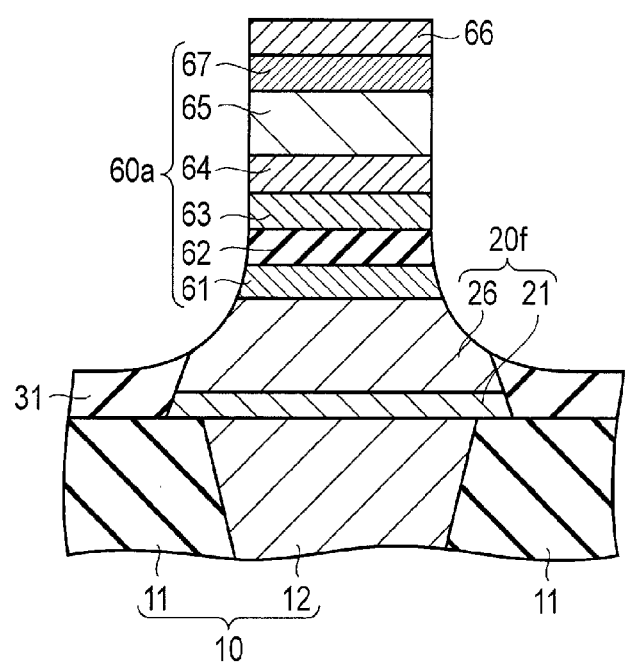
F I G. 21

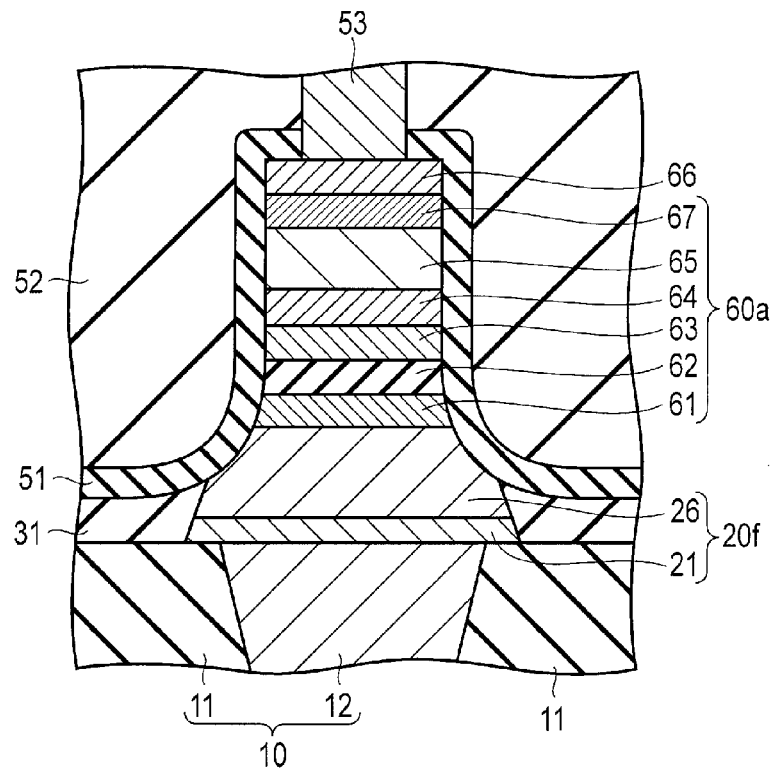
F I G. 22
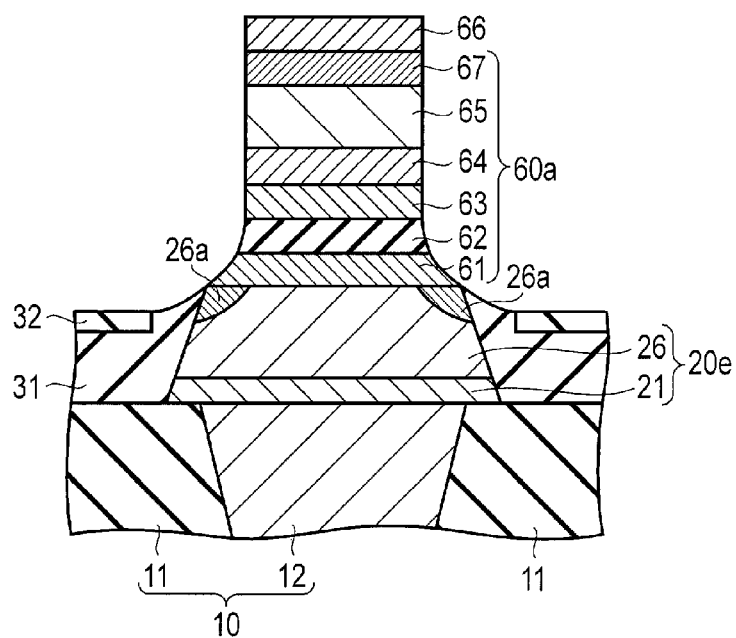
F I G. 23

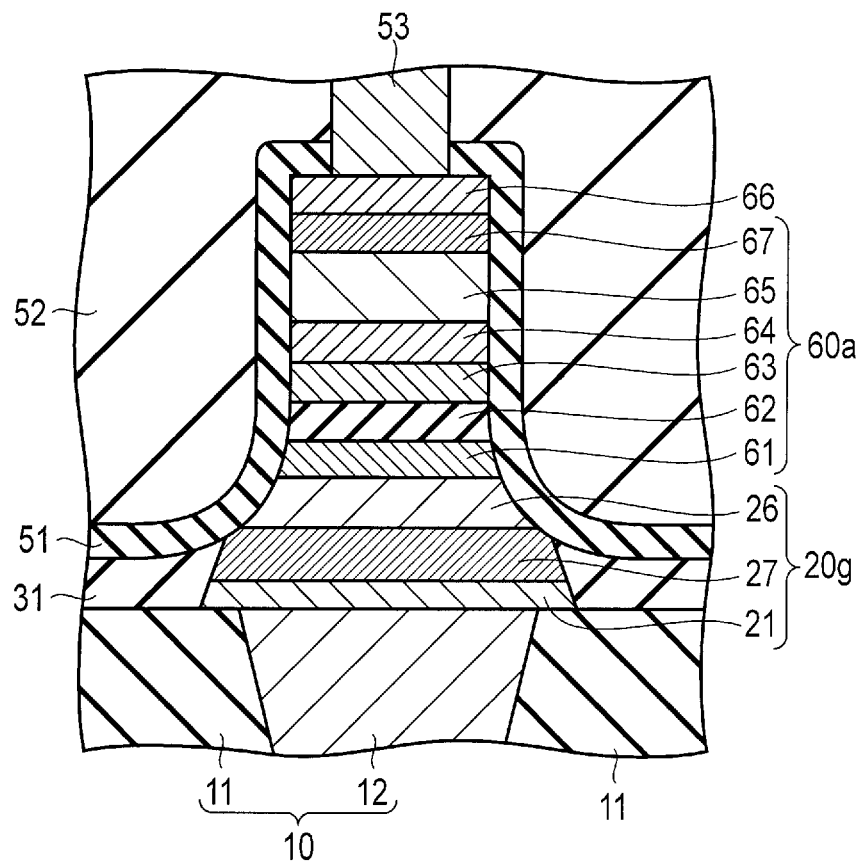
F I G. 24

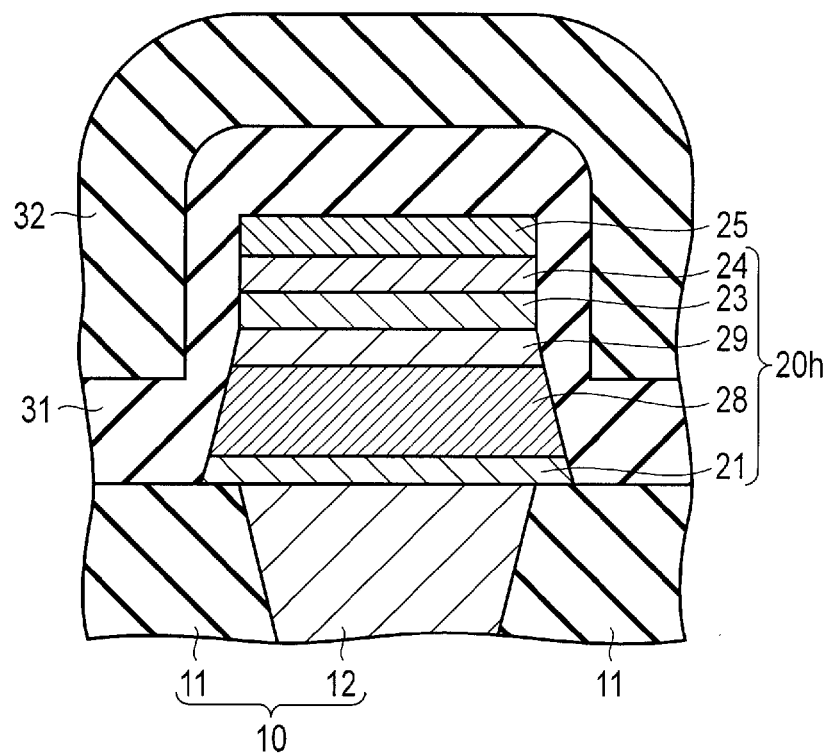
F I G. 27
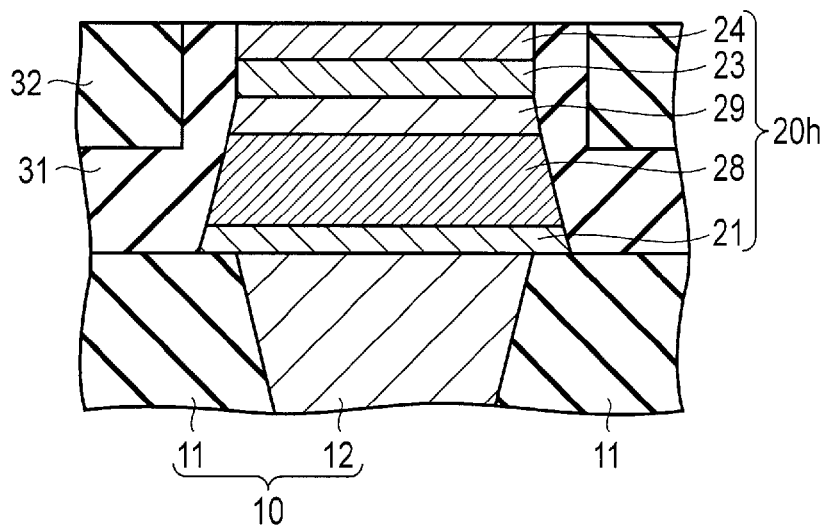
F I G. 28

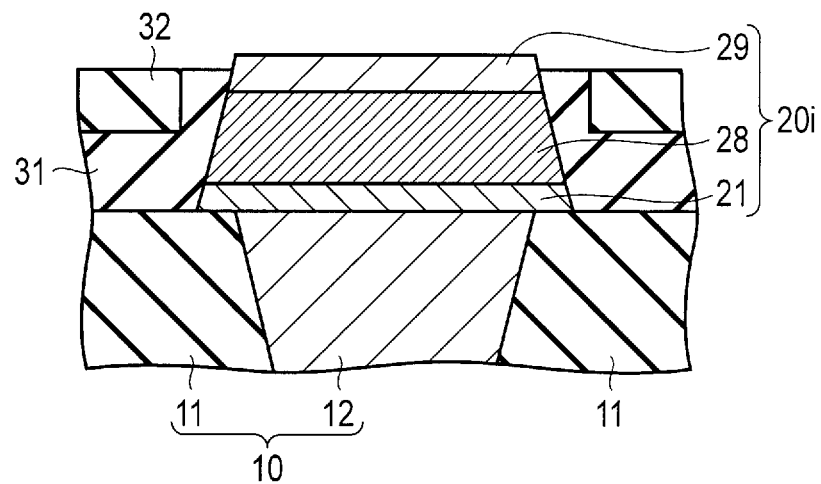
F I G. 29
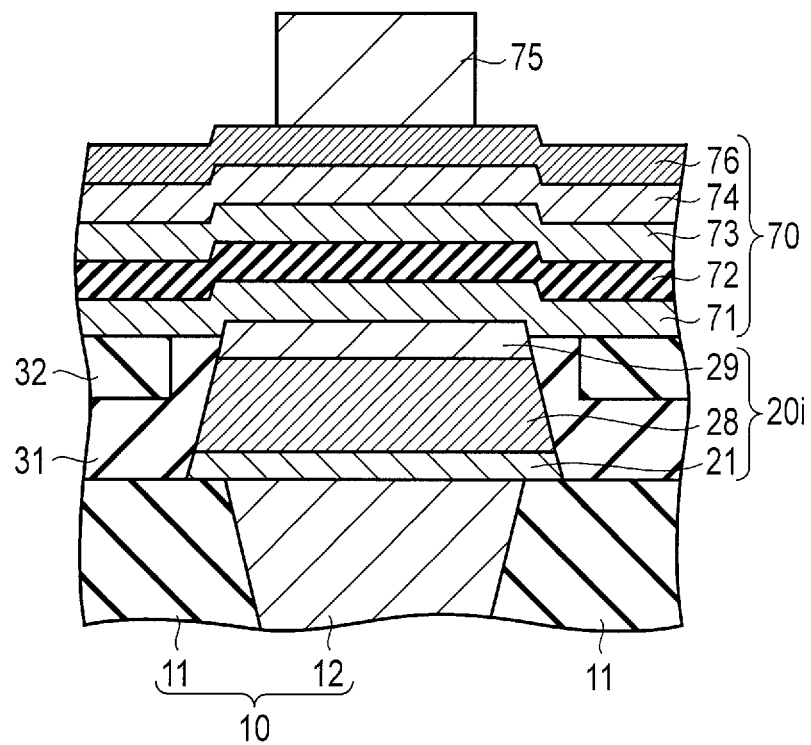
F I G. 30

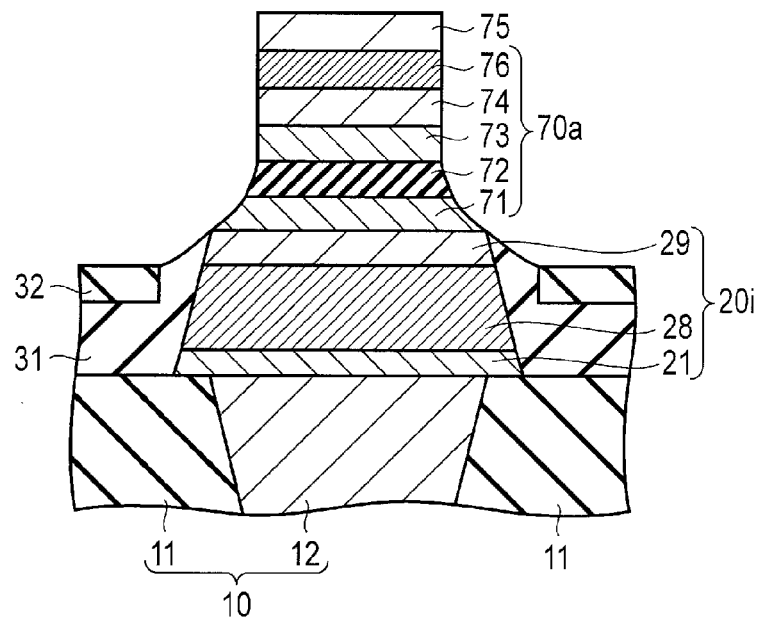
F I G. 31
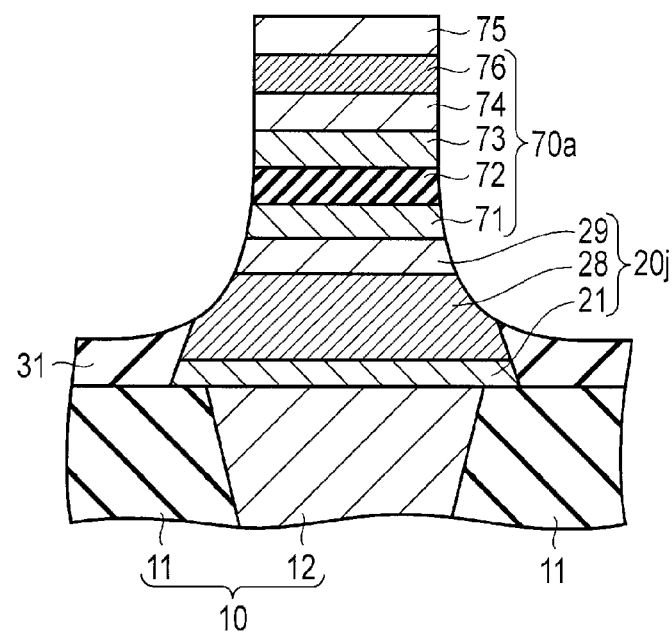
F I G. 32

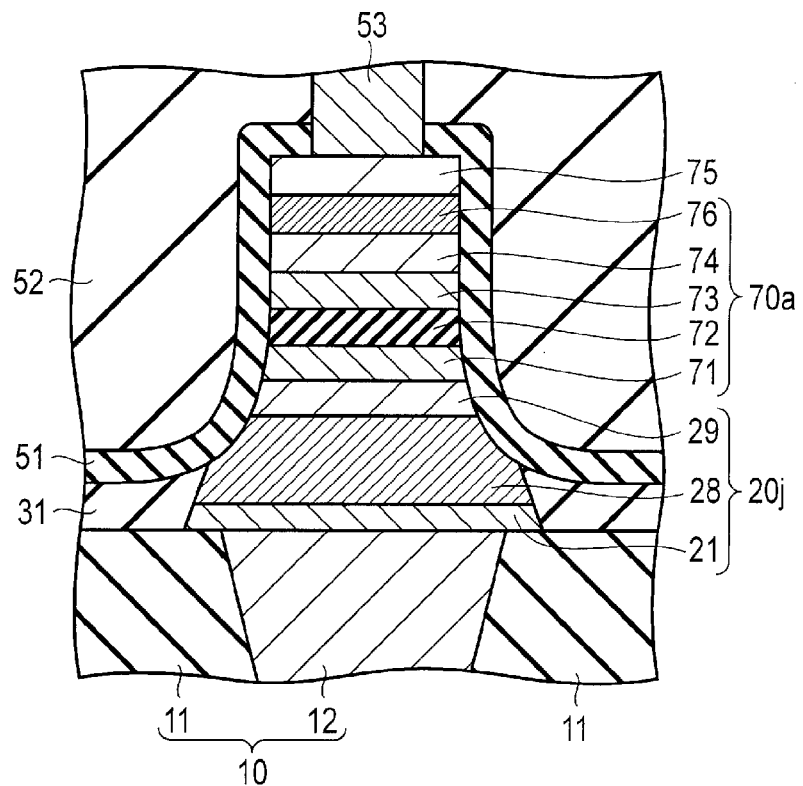
F I G. 33
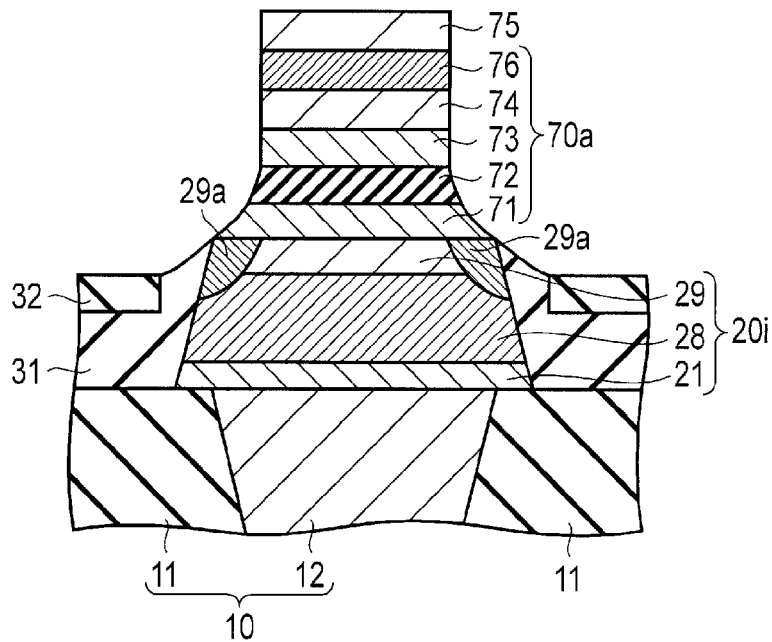
F I G. 34

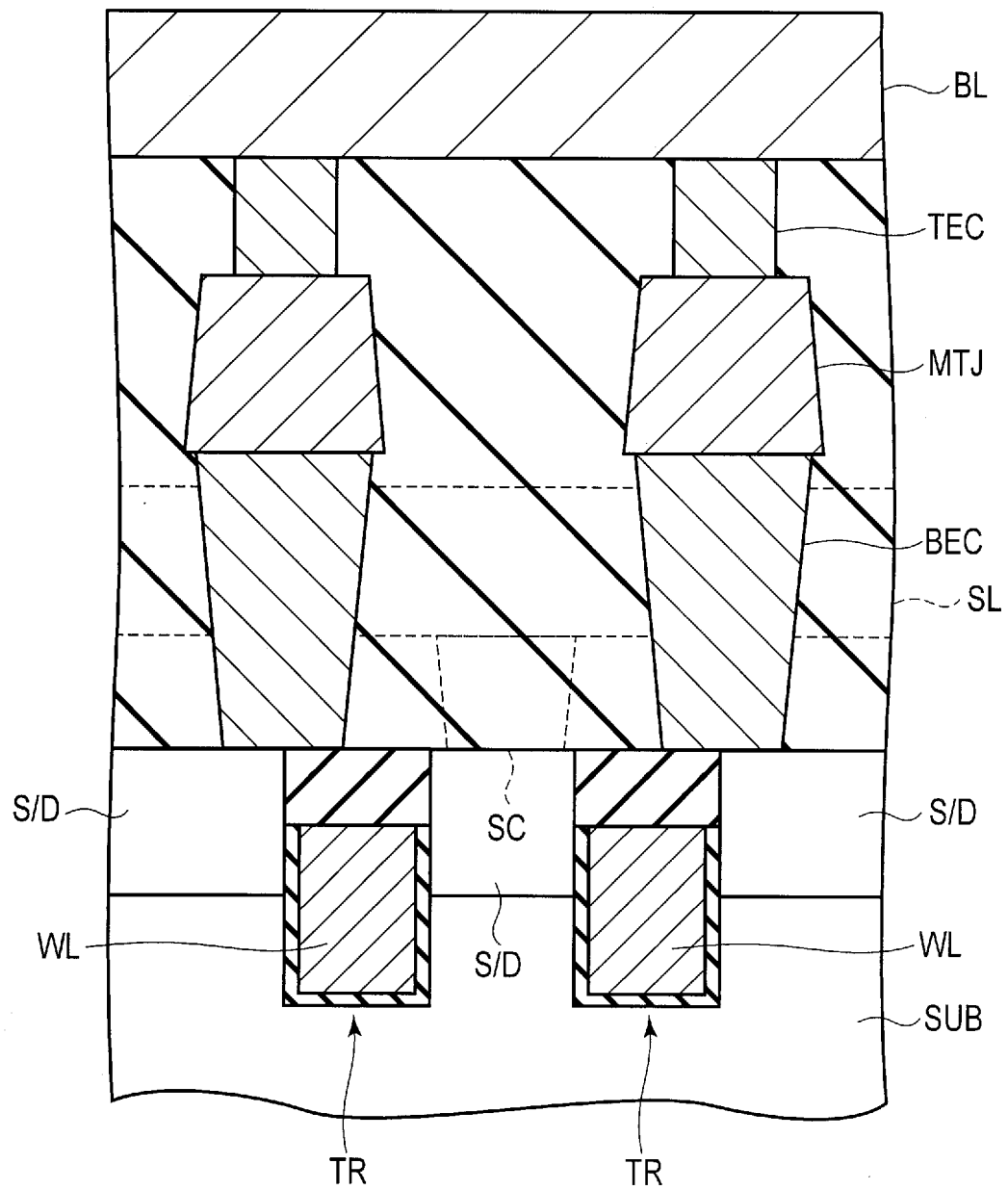
F I G. 35

MAGNETIC MEMORY DEVICE AND METHOD OF MANUFACTURING MAGNETIC MEMORY DEVICE

CROSS-REFERENCE TO RELATED APPLICATIONS

This application claims the benefit of U.S. Provisional Application No. 62/049,097, filed Sep. 11, 2014, the entire contents of which are incorporated herein by reference.

FIELD

Embodiments described herein relate generally to a magnetic memory device and a method of manufacturing the magnetic memory device.

BACKGROUND

Magnetic memory devices in which a magnetoresistive effect element is formed on a semiconductor substrate have been offered.

The above-described magnetoresistive effect element comprises a structure in which, for example, a storage layer, a tunnel barrier layer, a reference layer and a shift cancelling layer are stacked in this order. The shift cancelling layer is used for cancelling a magnetic field applied from the reference layer to the storage layer. In existing magnetoresistive effect elements, for example, since a shift cancelling layer is stacked on a reference layer, a thick shift cancelling layer is needed. Therefore, the total thickness (height) of a stack structure becomes great.

The stack structure is formed by processing a stack film by ion beam etching (IBE). In this case, the stack film is processed by applying an ion beam in an oblique direction. Therefore, when the ratio of the height of the stack structure to the width of the space between the stack structures adjacent to each other is high, it is difficult to process the stack film by IBE due to a shadow effect. For example, the limit value of the above-described ratio is about one. As a magnetoresistive effect element is further miniaturized, the above-described ratio becomes greater, and thus it becomes more difficult to process the stack film by IBE.

Further, a structure in which either a shift cancelling layer or a reference layer is provided on the lower layer side of a storage layer has been offered. In a case where this structure is adopted, it is necessary to combine IBE and reactive ion etching (RIE) to form a stack structure. However, it is difficult to perform a precise etching control by RIE.

As described above, as a magnetic memory device is miniaturized, it becomes difficult to form a stack structure accurately.

Therefore, there is demand for a magnetic memory device with an accurate stack structure and for a method of manufacturing such a magnetic memory device.

BRIEF DESCRIPTION OF THE DRAWINGS

FIG. 3 is an exemplary sectional view of a part of the manufacturing method of the magnetic memory device of the first embodiment.

FIG. 4 is an exemplary sectional view of a part of the manufacturing method of the magnetic memory device of the first embodiment.

FIG. 5 is an exemplary sectional view of a part of the manufacturing method of the magnetic memory device of the first embodiment.

FIG. 6 is an exemplary sectional view of a part of the manufacturing method of the magnetic memory device of the first embodiment.

FIG. 9 is an exemplary sectional view of a part of the manufacturing method of the magnetic memory device of the first embodiment.

FIG. 10 is a sectional view of a case of the first embodiment where a positional gap is created between a lower structure and an upper structure.

FIG. 16 is an exemplary sectional view of a part of the manufacturing method of the magnetic memory device of the second embodiment.

FIG. 17 is an exemplary sectional view of a part of the manufacturing method of the magnetic memory device of the second embodiment.

FIG. 20 is an exemplary sectional view of a part of the manufacturing method of the magnetic memory device of the second embodiment.

FIG. 21 is an exemplary sectional view of a part of the manufacturing method of the magnetic memory device of the second embodiment.

FIG. 22 is an exemplary sectional view of a part of the manufacturing method of the magnetic memory device of the second embodiment.

FIG. 23 is an exemplary sectional view of a part of a manufacturing method of a magnetic memory device of the first modified example of the second embodiment.

FIG. 24 is an exemplary sectional view of a structure of a magnetic memory device of the second modified example of the second embodiment.

FIG. 27 is an exemplary sectional view of a part of the manufacturing method of the magnetic memory device of the third embodiment.

FIG. 28 is an exemplary sectional view of a part of the manufacturing method of the magnetic memory device of the third embodiment.

FIG. 29 is an exemplary sectional view of a part of the manufacturing method of the magnetic memory device of the third embodiment.

FIG. 30 is an exemplary sectional view of a part of the manufacturing method of the magnetic memory device of the third embodiment.

FIG. 31 is an exemplary sectional view of a part of the manufacturing method of the magnetic memory device of the third embodiment.

FIG. 32 is an exemplary sectional view of a part of the manufacturing method of the magnetic memory device of the third embodiment.

FIG. 33 is an exemplary sectional view of a part of the manufacturing method of the magnetic memory device of the third embodiment.

FIG. 34 is an exemplary sectional view of a part of a manufacturing method of a magnetic memory device of a modified example of the third embodiment.

FIG. 35 is a view schematically showing a general structure of a semiconductor integrated circuit device in which a magnetoresistive effect element (MTJ element) is employed.

DETAILED DESCRIPTION

In general, according to one embodiment, a method of manufacturing a magnetic memory device comprising a stack structure formed of a plurality of layers including a magnetic layer, the method includes: forming a lower structure film including at least one layer; etching the lower structure film to form a lower structure of the stack structure; forming an upper structure film including at least one layer on a region including the lower structure; and etching the upper structure film to form an upper structure of the stack structure on the lower structure.

First Embodiment

First, a magnetic memory device comprising a magnetoresistive effect element of the first embodiment will be described. Note that the magnetoresistive effect element may also be called a magnetic tunnel junction (MTJ) element in the following descriptions.

FIGS. 1 to 9 are exemplary sectional views of a manufacturing method of the magnetic memory device of the present embodiment.

Figure 1:
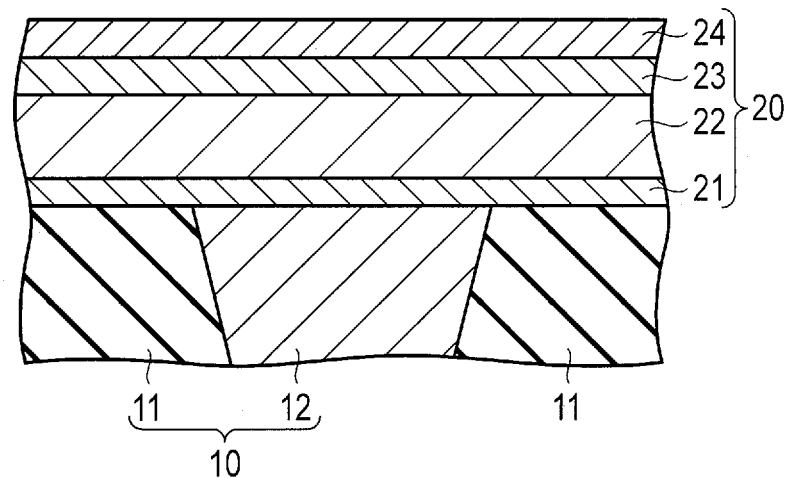
FIG. 1 is an exemplary sectional view of a part of a manufacturing method of a magnetic memory device of the first embodiment.

First, as illustrated in FIG. 1, an underlying region 10 including an interlayer insulating film 11, a bottom electrode 12 and the like is formed on a semiconductor substrate (not shown).

Then, on the underlying region 10, a lower structure film 20 including at least one layer is formed. More specifically, a stack film of an underlayer 21, a shift cancelling layer 22, a cap layer 23 and a stopper layer 24 is formed as the lower structure film 20.

Figure 2:
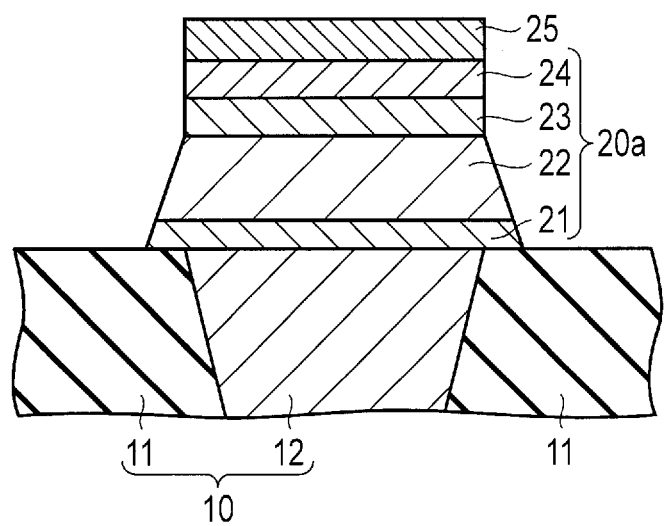
FIG. 2 is an exemplary sectional view of a part of the manufacturing method of the magnetic memory device of the first embodiment.

As illustrated in FIG. 2, a hard mask 25 is then formed on the lower structure film 20. Subsequently, the lower structure film 20 is etched by using the hard mask 25 as a mask to form a lower structure 20a. The etching of the lower structure film 20 is performed by ion beam etching (IBE). In this IBE, an ion beam is applied obliquely onto the lower structure film 20. More specifically, an ion beam is applied onto the lower structure film 20 at an angle of about 45 degrees to the stack direction of the lower structure film 20. For the ion beam, an argon (Ar) beam is used. As the ion beam, argon (Ar), neon (Ne) or xenon (Xe), or a gaseous mixture thereof can be used. In IBE, an ion generated in a plasma source is extracted by means of a potential gradient, and the extracted ion is applied onto the substrate to perform etching. In the potential application methods for extracting an ion, there are a grid method, an RF bias application method onto the substrate, a DC bias application method and the like.

As illustrated in FIG. 3, a protective insulating film 31 covering the lower structure 20a and the hard mask 25 is then formed. Subsequently, an interlayer insulating film 32 covering the protective insulating film 31 is formed.

Then, as illustrated in FIG. 4, chemical mechanical polishing (CMP) is performed by using the stopper layer 24 as a stopper. By doing this, the protective insulating film 31 and the interlayer insulating film 32 are planarized and smoothed.

As illustrated in FIG. 5, physical etching is then performed by IBE. By doing this, the stopper layer 24 is removed, and then the lower structure 20b is obtained. The physical etching may be performed by a gas cluster ion beam (GCIB) in place of IBE. In this case, the evenness of the surface of the lower structure is preferably 0.1 nm or less. Further, in the GCIB, due to a lateral etching effect by a cluster effect, it is possible to obtain a surface with evenness of 0.1 nm or less. A similar effect can also be realized by performing IBE at a steep angle of 45 degrees or more.

Subsequently, as illustrated in FIG. 6, on a region including the lower structure 20b, an upper structure film 40 including at least one layer is formed. More specifically, on the region including the lower structure 20b, a stack film of an intermediate layer 41, a storage layer 42, a tunnel barrier layer 43, a reference layer 44 and a cap layer 47 is formed as the upper structure film 40. Then, on the upper structure film 40, a hard mask 45 is formed. As the material for the hard mask, W, Ta, Hf, TaN, WN, TiN, HfN, TaC, TiC, WC or HfC, or a compound thereof can be used. Further, diamond-like carbon (DLC), SiC or the like can be used as well.

Figure 7:
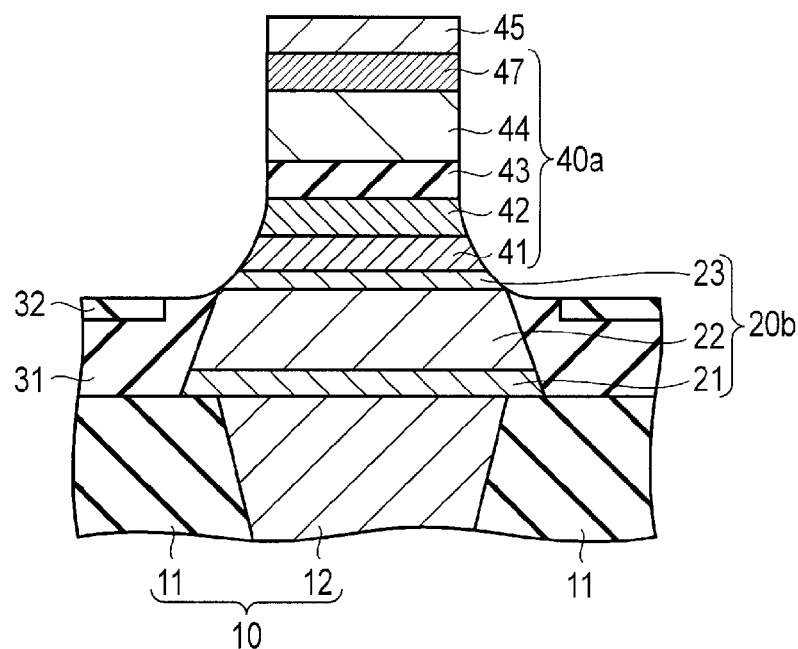
FIG. 7 is an exemplary sectional view of a part of the manufacturing method of the magnetic memory device of the first embodiment.

As illustrated in FIG. 7, by using the hard mask 45 as a mask, the upper structure film 40 is etched to form an upper structure 40a on the lower structure 20b. The etching of the upper structure film 40 is performed by IBE. In this IBE, an ion beam is applied obliquely onto the upper structure film 40. More specifically, an ion beam is mainly applied onto the upper structure film 40 at an angle of about 45 degrees to the stack direction of the upper structure film 40. For the ion beam, an argon (Ar) beam is used. As the ion beam, argon (Ar), neon (Ne) or xenon (Xe), or a gaseous mixture thereof can be used. In IBE, an ion generated in a plasma source is extracted by means of a potential gradient, and the extracted ion is applied onto the substrate to perform etching. In the potential application methods for extracting an ion, there are the grid method, the RF bias application method onto the substrate, the DC bias application method and the like.

Figure 8:
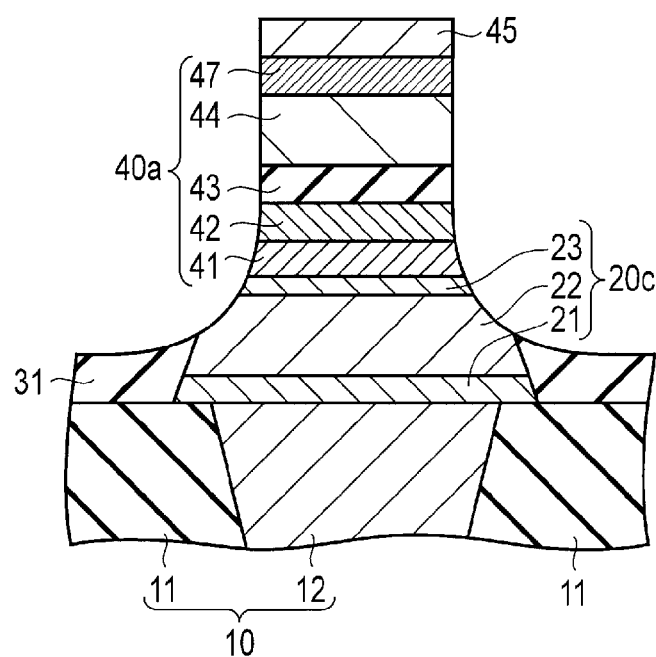
FIG. 8 is an exemplary sectional view of a part of the manufacturing method of the magnetic memory device of the first embodiment.

Then, as illustrated in FIG. 8, IBE is continuously performed from the process of FIG. 7. That is, overetching of IBE is performed. By doing this, a portion of the lower structure 20b located outside the upper structure 40a is etched by using the upper structure 40a as a mask. More specifically, the upper corner of the lower structure 20b and a portion adjacent to the upper corner are removed. Further, a part of the protective insulating film 31 and the interlayer insulating film 32 are removed as well. As a result, a lower structure 20c is obtained.

As illustrated in FIG. 9, a protective insulating film 51 covering the stack structure of the lower structure 20c and the upper structure 40a is then formed. Subsequently, an interlayer insulating film 52 covering the protective insulating film 51 is formed. Further, a hole is created in the protective insulating film 51 and the interlayer insulating film 52, and in the hole, a top electrode 53 is formed.

In the above-described manner, the magnetic memory device of FIG. 9 is obtained. That is, a magnetic memory device comprising a stack structure formed of a plurality of layers including a magnetic layer, and further comprising the stack structure of the lower structure 20c and the upper structure 40a is obtained.

Further, as can be understood from the above-described manufacturing method, the pattern of the hard mask 25 is larger than the pattern of the hard mask 45. Therefore, the pattern of the lower structure 20c is larger than the pattern of the upper structure 40a, and when viewed from a direction parallel to the stack direction of the stack structure, the lower structure 20c includes a portion located outside the upper structure 40a.

Still further, as described earlier, by the overetching of IBE shown in FIG. 8, the upper corner of the lower structure 20c and the portion adjacent to the upper corner are removed (missing). In other word, an upper corner portion of the lower structure 20c has a concave shape.

Still further, in the stack structure including the lower structure 20c and the upper structure 40a, a magnetoresistive effect element (MTJ element) is formed. That is, in the stack structure, the storage layer 42 (first magnetic layer) having variable magnetization, the reference layer 44 (second magnetic layer) having fixed magnetization, the tunnel barrier layer 43 (non-magnetic layer) provided between the storage layer 42 and the reference layer 44 are included. Further, in the stack structure, the shift cancelling layer 22 (third magnetic layer) for cancelling a magnetic field applied from the reference layer 44 to the storage layer 42 is included.

The above-described MTJ element is a magnetic element having perpendicular magnetization. That is, the storage layer 42, the reference layer 44 and the shift cancelling layer 22 are magnetized in a direction perpendicular to the surfaces of these respective layers. Further, the reference layer 44 and the shift cancelling layer 22 are magnetized in directions opposite to each other. A tunnel magnetoresistance effect occurs in the MTJ element by the relationship of the directions of magnetization of the storage layer 42 and the reference layer 44. When the direction of magnetization of the storage layer 42 and the direction of magnetization of the reference layer 44 are parallel, the MTJ element is in a low-resistance state. When the direction of magnetization of the storage layer 42 and the direction of magnetization of the reference layer 44 are antiparallel, the MTJ element is in a high-resistance state. It is possible to store binary 0 or 1 based on whether the MTJ element is in the low-resistance state or in the high-resistance state. Further, it is possible to write binary 0 or 1 based on the direction of current flowing through the MTJ element.

Note that, for the storage layer 42 and the reference layer 44, a CoFeB layer can be used. A stack film of a CoFeB layer and a CoPt layer may be used as well. For the tunnel barrier layer 43, an MgO layer or an MgAlO layer can be used. Further, for the shift cancelling layer 22, a CoPt layer can be used. Here, the CoPt layer includes a layer using Co and Pt such as an alloy layer containing Co and Pt and a Co/Pt stack film in which a Co layer and a Pt layer are alternately stacked.

Further, for the shift cancelling layer, a FePt layer can be used as well. Here, the FePt layer is a FePt alloy primarily containing Fe and Pt and having an L10 ordered structure. Since the FePt layer displays excellent heat resistance, it is preferable that the FePt layer be used as the shift cancelling layer of the lower structure. When the FePt layer is used as the lower structure film, it is possible to freely perform annealing necessary for forming the L10 ordered structure. The FePt layer can also be formed by a Fe/Pt stack method.

As described above, in the present embodiment, after the lower structure of the stack structure is formed by IBE, the upper structure of the stack structure is formed by IBE. Therefore, the stack structure can be formed only by IBE, and thus it is possible to exhibit an excellent controllability to form a stack structure without seriously damaging the sidewall of the stack structure. In IBE, by controlling an accelerating voltage, it is possible to minimize the damage. Consequently, even when the element is miniaturized, it is possible to accurately form the stack structure, and thus an excellent magnetic memory device can be obtained.

In the above-described embodiment, the lower structure 20a is formed by using the hard mask 25 as a mask, and the upper structure 40a is formed by using the hard mask 45 as a mask. The hard mask 25 and the hard mask 45 are both formed by using a lithography technique. In the alignment of lithography, an alignment error usually occurs. Therefore, a positional gap is usually created between the lower structure 20c and the upper structure 40a. That is, when viewed from a direction parallel to the stack direction of the stack structure, the center of the upper structure 40a is shifted from the center of the lower structure 20c. Usually, in consideration of the misalignment between the upper structure and the lower structure, the lower structure is designed to become larger than the upper structure. The reason is that it is difficult to avoid the misalignment between the upper structure and the lower structure when such lithography as to be performed twice is used.

FIG. 10 is a sectional view of a case where a positional gap is created between the lower structure 20c and the upper structure 40a. As illustrated in FIG. 10, the center C2 of the upper structure 40a is shifted from the center C1 of the lower structure 20c.

When there is a positional gap between the lower structure 20c and the upper structure 40a, and if an overetching process of FIG. 8 is not carried out, the following problem might arise. This point will now be described below.

When a positional gap is created between the lower structure 20c and the upper structure 40a, the intensity distribution of the magnetic field applied from the shift cancelling layer to the upper structure becomes asymmetrical. Further, in general, a leakage magnetic field from a magnetic material becomes larger in a corner portion of the magnetic material because of the impact of the demagnetizing field of the magnetic material itself. In a portion away from the corner portion of the magnetic material, the influence of the demagnetizing field becomes weaker and thus the leakage magnetic field becomes smaller. Therefore, when an overetching process is not performed, the magnetic field becomes strong in the upper corner of the shift cancelling layer 22. That is, the magnetic field becomes strong in the upper corner of the lower structure 20c. In this situation, when there is a positional gap between the lower structure 20c and the upper structure 40a, the degree of asymmetry of the magnetic field intensity distribution becomes extremely high. As a result, this makes a considerably negative impact on the characteristics of an MTJ element. For example, when there are various positional gaps between the lower structures 20c and the upper structures 40a in a chip or a wafer, this leads to a problem of variations in the characteristics of the MTJ elements in a chip.

In the present embodiment, by the overetching process of FIG. 8, the upper corner of the lower structure 20c and a portion adjacent to the upper corner are removed to conform to the upper structure 40a. That is, such an effect that the upper structure and the lower structure are formed self-alignedly is produced. Further, it is possible to weaken the leakage magnetic field from the original upper corner portion of the lower structure 20c. This is because, by performing overetching, the upper corner portion of the lower structure falls back and thus the influence of the leakage magnetic field from the corner portion is reduced. As a result, even when there is a positional gap between the lower structure 20c and the upper structure 40a, the degree of asymmetry of the magnetic field intensity distribution can be significantly decreased. Therefore, it is possible to reduce the variations in the characteristics of MTJ elements, and thus an excellent magnetic memory device can be obtained.

Note that, although it is desirable to perform the overetching process of FIG. 8 for the above reason, when the positional gap between the lower structure 20c and the upper structure 40a is not so serious as to become a problem, the overetching process may not be carried out. In this case, it is desirable that the etching of the upper structure be stopped in the lowest layer of the upper structure, namely, the intermediate layer.

Next, the first modified example of the present embodiment will be described. Note that, since basic points are similar to those of the above-described embodiment, points described in the above embodiment are omitted.

Figure 11:
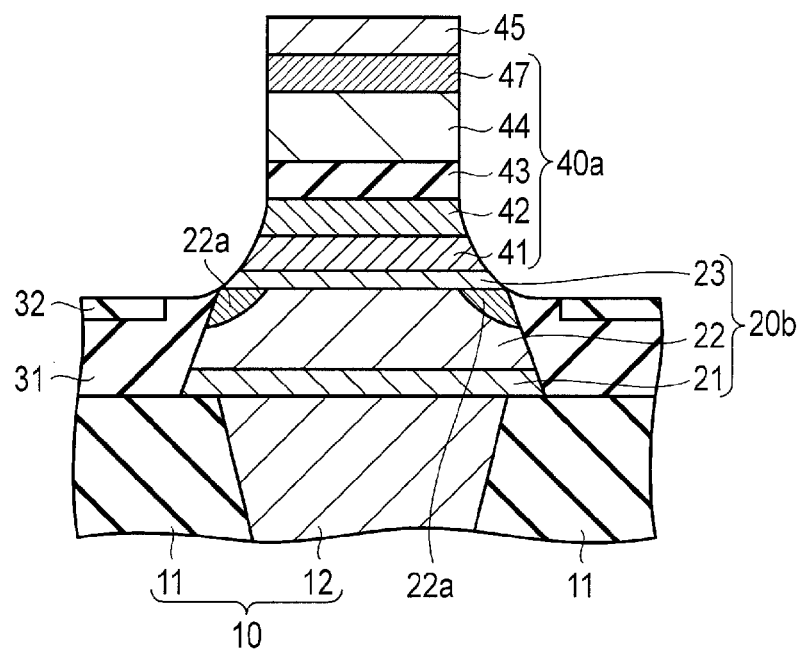
FIG. 11 is an exemplary sectional view of a part of a manufacturing method of a magnetic memory device of the first modified example of the first embodiment.

FIG. 11 is an exemplary sectional view of a part of a manufacturing method of the magnetic memory device of the first modified example of the present embedment.

In the present modified example, in order to prevent concentration of a magnetic field in the upper corner of the lower structure 20c, a predetermined ion is implanted in the upper corner of the lower structure 20b and a portion adjacent to the upper corner. More specifically, after the process of FIG. 7 in the above-described embodiment, the predetermined ion is implanted in a portion of the lower structure 20b located outside the upper structure 40a by using the upper structure 40a as a mask. By doing this, an ion implantation region 22a is formed in the upper corner of the shift cancelling layer 22 and the portion adjacent to the upper corner. Note that, although the ion implantation region 22a may be formed by using an ion implantation device, it is also possible to form it after the IBE process of FIG. 7 by implanting an ion by changing the accelerating voltage of IBE. Further, since an ion implantation effect is produced depending on the accelerating voltage of IBE, there is a case where an ion is also implanted during the IBE process of FIG. 7. When an ion is implanted by an ion implantation device or an IBE device, so as to avoid damaging the sidewall surface of the MTJ element, the ion irradiation angle should preferably be in the range of 0 to 30 degrees to the substrate surface.

As can be understood from the above description, the lower structure includes a first portion which corresponding to the ion implantation region 22a, and a second portion which includes a portion of the lower structure 20c excluding the first portion. The predetermined ion is contained in the first portion, and a concentration of the predetermined ion in the first portion is higher than that in the second portion.

For the predetermined ion, an inert gas ion such as an argon (Ar) ion can be used. Further, a silicon (Si) ion, a phosphorus (P) ion, a boron (B) ion, a nitrogen (N) ion and the like may be used as well.

Figure 12:
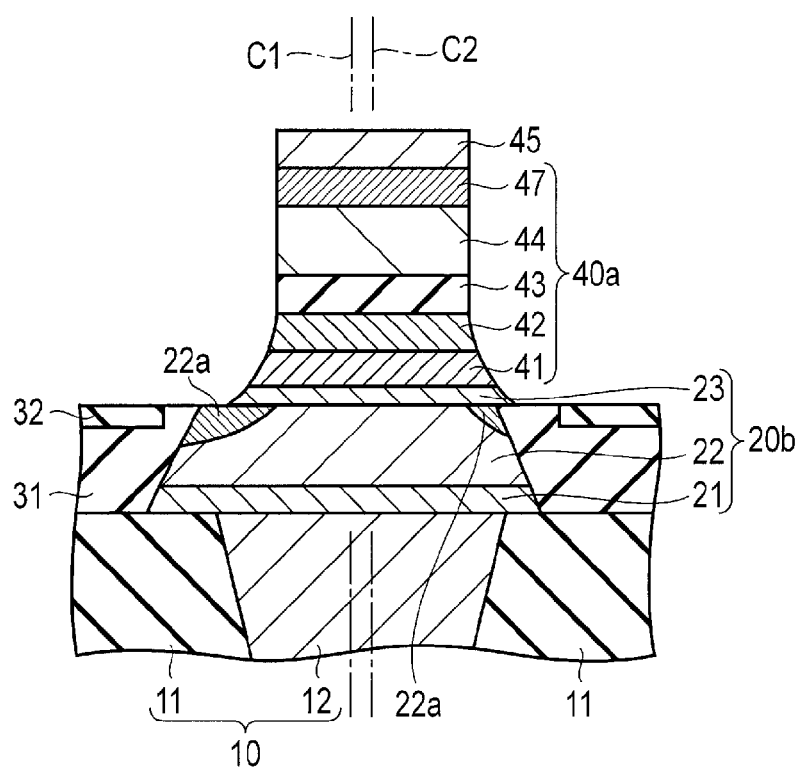
FIG. 12 is a sectional view of a case of the first modified example of the first embodiment where a positional gap is created between a lower structure and an upper structure.

A portion (ion implantation region 22a) to which an ion is implanted is magnetically deactivated. Therefore, it is possible to prevent the concentration of a magnetic field in the upper corner of the lower structure 20b. As a result, as illustrated in FIG. 12, even when there is a positional gap between the lower structure 20b and the upper structure 40a, the degree of asymmetry of the magnetic field intensity distribution can be significantly decreased. Therefore, in a manner similar to that of the above-describe embodiment, it is possible to reduce the variations and the like of the characteristics of MTJ elements, and thus an excellent magnetic memory device can be obtained.

Next, the second modified example of the present embodiment will be described. Note that, since basic points are similar to those of the above-described embodiment, points described in the above embodiment are omitted.

Figure 13:
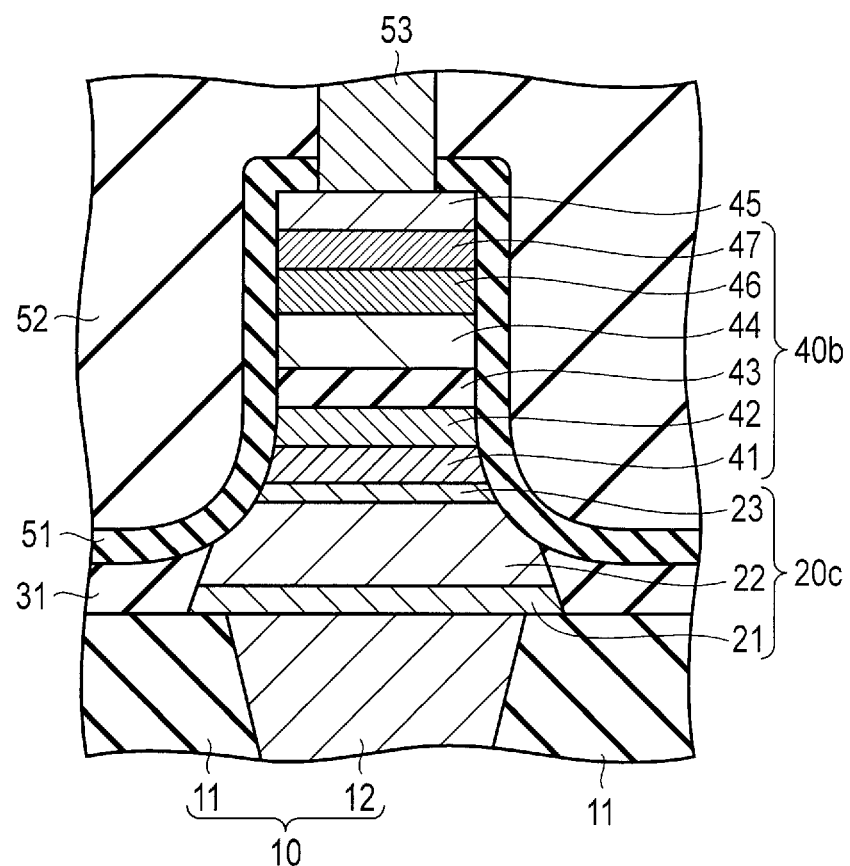
FIG. 13 is an exemplary sectional view of a structure of a magnetic memory device of the second modified example of the first embodiment.

FIG. 13 is an exemplary sectional view of a structure of a magnetic memory device of the second modified example of the present embodiment.

In the present modified example, in addition to the shift cancelling layer 22, a shift cancelling layer 46 is formed also on the reference layer 44. Therefore, in the present modified example, the shift cancelling layer 46 is included in the upper structure 40b as well. By providing two shift cancelling layers in this way, it is possible to reliably obtain the effect of a shift cancelling layer.

Also in the present modified example, basic structures and basic manufacturing methods are similar to those of the above-described embodiment. Therefore, also in the present modified example, it is possible to obtain an effect similar to that produced by the above-described embodiment.

Second Embodiment

Next, a magnetic memory device comprising a magnetoresistive effect element of the second embodiment will be described. Note that basic structures and basic manufacturing methods are similar to those of the first embodiment. Therefore, points described in the first embodiment are omitted.

FIGS. 14 to 22 are exemplary sectional views of a manufacturing method of the magnetic memory device of the present embodiment.

Figure 14:
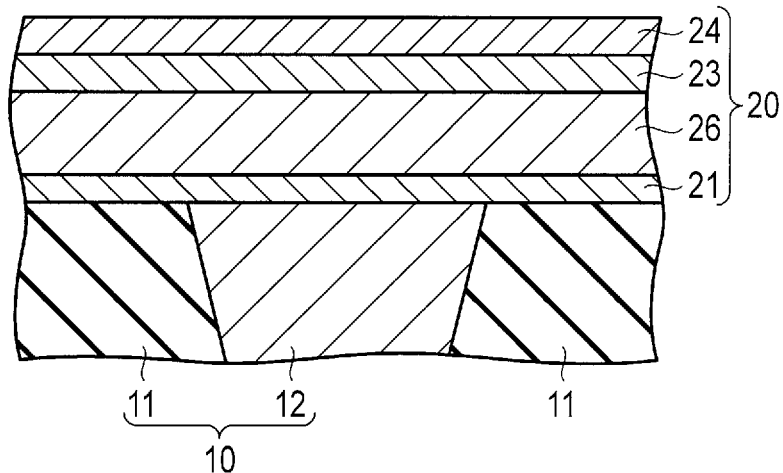
FIG. 14 is an exemplary sectional view of a part of a manufacturing method of a magnetic memory device of the second embodiment.

First, as illustrated in FIG. 14, the underlying region 10 including the interlayer insulating film 11, the bottom electrode 12 and the like is formed on the semiconductor substrate (not shown).

Then, on the underlying region 10, the lower structure film 20 including at least one layer is formed. More specifically, a stack film of the underlayer 21, a reference layer 26, the cap layer 23 and the stopper layer 24 is formed as the lower structure film 20.

Figure 15:
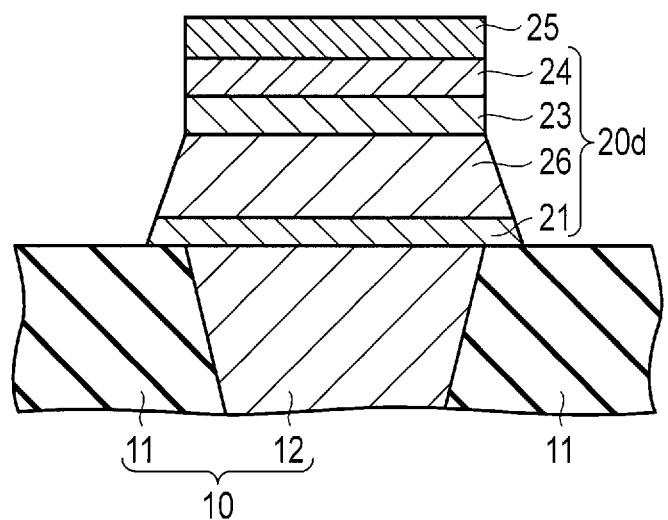
FIG. 15 is an exemplary sectional view of a part of the manufacturing method of the magnetic memory device of the second embodiment.

As illustrated in FIG. 15, the hard mask 25 is then formed on the lower structure film 20. Subsequently, the lower structure film 20 is etched by using the hard mask 25 as a mask to form a lower structure 20d. The etching of the lower structure film 20 is performed by IBE. The specific method of this IBE is similar to that of the first embodiment.

Then, as illustrated in FIG. 16, the protective insulating film 31 covering the lower structure 20d and the hard mask 25 is formed. Subsequently, the interlayer insulating film 32 covering the protective insulating film 31 is formed.

As illustrated in FIG. 17, CMP is then performed by using the stopper layer 24 as a stopper. By doing this, the protective insulating film 31 and the interlayer insulating film 32 are planarized.

Figure 18:
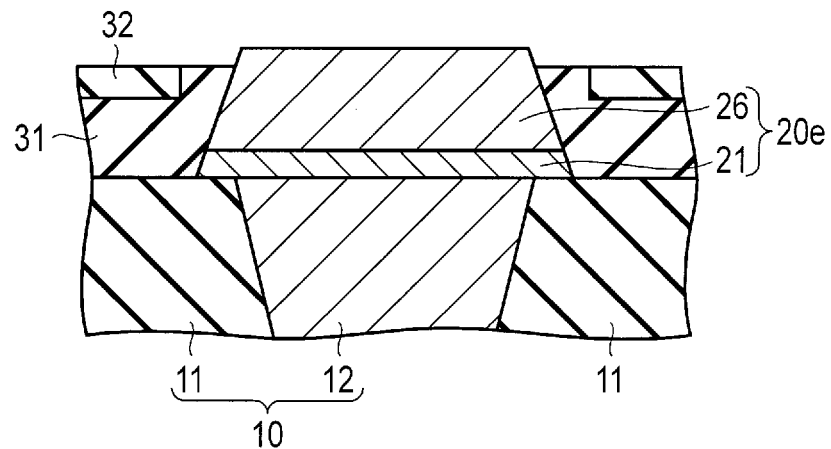
FIG. 18 is an exemplary sectional view of a part of the manufacturing method of the magnetic memory device of the second embodiment.

Then, as illustrated in FIG. 18, physical etching is then performed by IBE. By doing this, the cap layer 23 and the stopper layer 24 are removed, and a lower structure 20e is obtained. The physical etching may be performed by a GCIB in place of IBE. In the GCIB, due to the lateral etching effect by the cluster effect, it is possible to obtain a surface with evenness of 0.1 nm or less. A similar effect can also be realized by performing IBE at a steep angle of 45 degrees or more.

Figure 19:
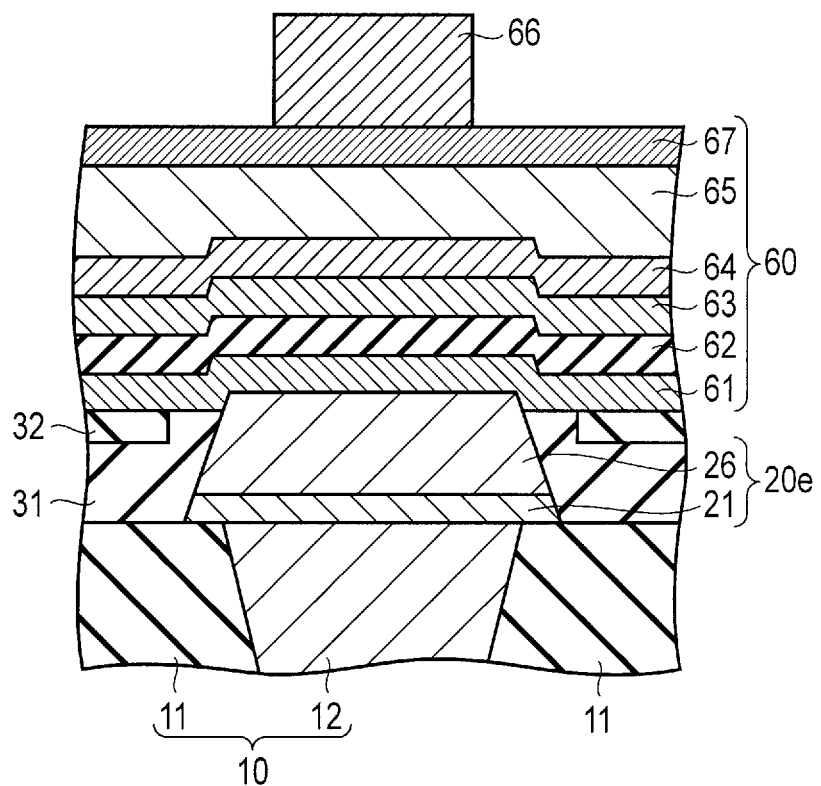
FIG. 19 is an exemplary sectional view of a part of the manufacturing method of the magnetic memory device of the second embodiment.

As illustrated in FIG. 19, on a region including the lower structure 20e, an upper structure film 60 including at least one layer is then formed. More specifically, on the region including the lower structure 20e, a stack film of an interface layer 61 (CoFeB layer), a tunnel barrier layer 62, a storage layer 63, an intermediate layer 64, a shift cancelling layer 65 and a cap layer 67 is formed as the upper structure film 60. Subsequently, a hard mask 66 is formed on the upper structure film 60.

Then, as illustrated in FIG. 20, by using the hard mask 66 as a mask, the upper structure film 60 is etched to form an upper structure 60a on the lower structure 20e. The etching of the upper structure film 60 is performed by IBE. The specific method of this IBE is similar to that of the first embodiment.

As illustrated in FIG. 21, in a manner similar to that of the first embodiment, overetching of IBE is performed. By doing this, a portion of the lower structure 20e located outside the upper structure 60a is etched by using the upper structure 60a as a mask. More specifically, the upper corner of the lower structure 20e and a portion adjacent to the upper corner are removed. Further, a part of the protective insulating film 31 and the interlayer insulating film 32 are removed as well. As a result, a lower structure 20f is obtained.

Subsequently, as illustrated in FIG. 22, a protective insulating film 51 covering the stack structure of the lower structure 20f and the upper structure 60a is formed. Then, an interlayer insulating film 52 covering the protective insulating film 51 is formed. Further, a hole is created in the protective insulating film 51 and the interlayer insulating film 52, and in the hole, the top electrode 53 is formed.

In the above-described manner, the magnetic memory device of FIG. 22 is obtained. That is, a magnetic memory device comprising a stack structure formed of a plurality of layers including a magnetic layer, and further comprising the stack structure of the lower structure 20f and the upper structure 60a is obtained.

Further, as can be understood from the above-described manufacturing method, the pattern of the hard mask 25 is larger than the pattern of the hard mask 66. Therefore, the pattern of the lower structure 20f is larger than the pattern of the upper structure 60a, and when viewed from a direction parallel to the stack direction of the stack structure, the lower structure 20f includes a portion located outside the upper structure 60a.

Still further, as described earlier, by the overetching of IBE shown in FIG. 21, the upper corner of the lower structure 20f and the portion adjacent to the upper corner are removed (missing).

Still further, in the stack structure including the lower structure 20f and the upper structure 60a, a magnetoresistive effect element (MTJ element) is formed. That is, in the stack structure, the storage layer 63 (first magnetic layer) having variable magnetization, the reference layer 26 (second magnetic layer) having fixed magnetization, the tunnel barrier layer 62 (non-magnetic layer) provided between the storage layer 63 and the reference layer 26 are included. Further, in the stack structure, the shift cancelling layer 65 (third magnetic layer) for cancelling a magnetic field applied from the reference layer 26 to the storage layer 63 is included.

As described above, also in the present embodiment, after the lower structure of the stack structure is formed by IBE, the upper structure of the stack structure is formed by IBE in a manner similar to that of the first embodiment. Therefore, the stack structure can be formed only by IBE, and thus an effect similar to that produced by the first embodiment can be obtained.

Still further, also in the present embodiment, by the overetching of FIG. 21, the upper corner of the lower structure 20f and the portion adjacent to the upper corner are removed in a manner similar to that of the first embodiment. Therefore, it is possible to prevent the concentration of a magnetic field in the upper corner of the lower structure 20f, and thus an effect similar to that produced by the first embodiment can be obtained.

Next, the first modified example of the present embodiment will be described. Note that, since basic points are similar to those of the present embodiment, points described in the above embodiment are omitted.

FIG. 23 is an exemplary sectional view of a part of a manufacturing method of the magnetic memory device of the first modified example of the present embodiment.

In the present modified example, a predetermined ion is implanted in the upper corner of the lower structure 20e and a portion adjacent to the upper corner in a manner similar to that of the first modified example of the present embodiment. More specifically, after the process of FIG. 20 in the above-described embodiment, the predetermined ion is implanted in a portion of the lower structure 20e located outside the upper structure 60a by using the upper structure 60a as a mask. By doing this, an ion implantation region 26a is formed in the upper corner of the reference layer 26 and the portion adjacent to the upper corner. The predetermined ion is similar to that of the first embodiment.

Also in the present modified example, the ion implantation region 26a is magnetically deactivated in a manner similar to that of the first modified example of the first embodiment. Therefore, it is possible to prevent the concentration of a magnetic field in the upper corner of the lower structure 20e, and thus an effect similar to that produced by the first modified example of the first embodiment can be obtained.

Next, the second modified example of the present embodiment will be described. Note that, since basic points are similar to those of the above-described embodiment, points described in the above embodiment are omitted.

FIG. 24 is an exemplary sectional view of a structure of a magnetic memory device of the second modified example of the present embodiment.

In the present modified example, in addition to the shift cancelling layer 65, a shift cancelling layer 27 is formed also below the reference layer 26. Therefore, in the present modified example, the shift cancelling layer 27 is included in a lower structure 20g as well. By providing two shift cancelling layers in this way, it is possible to reliably obtain the effect of a shift cancelling layer.

Also in the present modified example, basic structures and basic manufacturing methods are similar to those of the above-described embodiment. Therefore, also in the present modified example, an effect similar to that produced by the above-described embodiment can be obtained.

Third Embodiment

Next, a magnetic memory device comprising a magnetoresistive effect element of the third embodiment will be described. Note that basic structures and basic manufacturing methods are similar to those of the above-described first embodiment. Therefore, points described in the first embodiment are omitted.

FIGS. 25 to 33 are exemplary sectional views of a manufacturing method of the magnetic memory device of the present embodiment.

Figure 25:
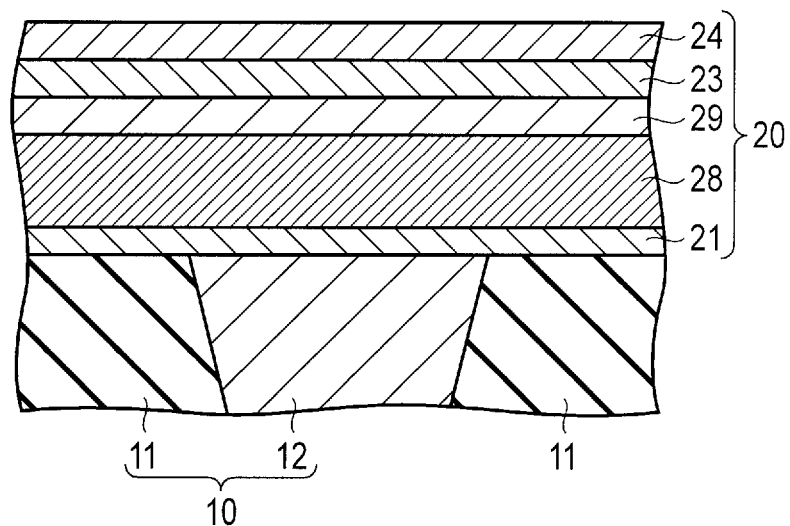
FIG. 25 is an exemplary sectional view of a part of a manufacturing method of a magnetic memory device of the third embodiment.

First, as illustrated in FIG. 25, the underlying region 10 including the interlayer insulating film 11, the bottom electrode 12 and the like is formed on the semiconductor substrate (not shown).

Then, on the underlying region 10, the lower structure film 20 including at least one layer is formed. More specifically, a stack film of the underlayer 21, a shift cancelling layer 28, a reference layer 29, the cap layer 23 and the stopper layer 24 is formed as the lower structure film 20.

Figure 26:
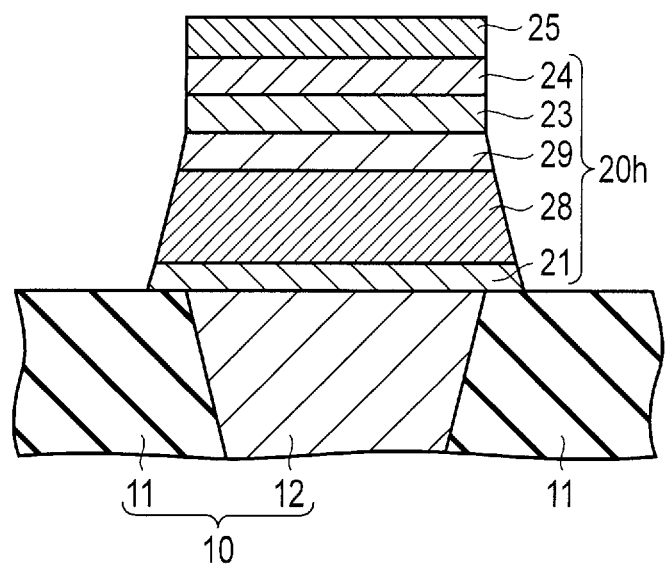
FIG. 26 is an exemplary sectional view of a part of the manufacturing method of the magnetic memory device of the third embodiment.

As illustrated in FIG. 26, the hard mask 25 is then formed on the lower structure film 20. Subsequently, the lower structure film 20 is etched by using the hard mask 25 as a mask to form a lower structure 20h. The etching of the lower structure film 20 is performed by IBE. The specific method of this IBE is similar to that of the first embodiment.

Then, as illustrated in FIG. 27, the protective insulating film 31 covering the lower structure 20h and the hard mask 25 is formed. Subsequently, the interlayer insulating film 32 covering the protective insulating film 31 is formed.

As illustrated in FIG. 28, CMP is then performed by using the stopper layer 24 as a stopper. By doing this, the protective insulating film 31 and the interlay insulating film 32 are planarized.

Then, as illustrated in FIG. 29, physical etching is performed by IBE. By doing this, the cap layer 23 and the stopper layer 24 are removed, and a lower structure 20i is obtained. The physical etching may be performed by a GCIB in place of IBE.

As illustrated in FIG. 30, on a region including the lower structure 20i, an upper structure film 70 including at least one layer is formed. More specifically, on the region including the lower structure 20i, a stack film of an interface layer 71 (CoFeB layer), a tunnel barrier layer 72, a storage layer 73, an intermediate layer 74 and a cap layer 76 is formed as the upper structure film 70. Subsequently, a hard mask 75 is formed on the upper structure film 70.

Then, as illustrated in FIG. 31, by using the hard mask 75 as a mask, the upper structure film 70 is etched to form an upper structure 70a on the lower structure 20i. The etching of the upper structure film 70 is performed by IBE. The specific method of this IBE is similar to that of the first embodiment.

As illustrated in FIG. 32, overetching of IBE is then performed in a manner similar to that of the first embodiment. By doing this, a portion of the lower structure 20i located outside the upper structure 70a is etched by using the upper structure 70a as a mask. More specifically, the upper corner of the lower structure 20i and a portion adjacent to the upper corner are removed. Further, a part of the protective insulating film 31 and the interlayer insulating film 32 are removed as well. As a result, a lower structure 20j is obtained.

Subsequently, as illustrated in FIG. 33, a protective insulating film 51 covering the stack structure of the lower structure 20j and the upper structure 70a is formed. Then, the interlayer insulating film 52 covering the protective insulating film 51 is formed. Further, a hole is created in the protective insulating film 51 and the interlayer insulating film 52, and in the hole, the top electrode 53 is formed.

In the above-described manner, the magnetic memory device of FIG. 33 is obtained. That is, a magnetic memory device comprising a stack structure formed of a plurality of layers including a magnetic layer, and further comprising the stack structure of the lower structure 20j and the upper structure 70a is obtained.

Further, as can be understood from the above-described manufacturing method, the pattern of the hard mask 25 is larger than the pattern of the hard mask 75. Therefore, the pattern of the lower structure 20j is larger than the pattern of the upper structure 70a, and when viewed from a direction parallel to the stack direction of the stack structure, the lower structure 20j includes a portion located outside the upper structure 70a.

Still further, as described earlier, by the overetching of IBE shown in FIG. 32, the upper corner of the lower structure 20j and the portion adjacent to the upper corner are removed (missing).

Still further, in the stack structure including the lower structure 20j and the upper structure 70a, a magnetoresistive effect element (MTJ element) is formed. That is, in the stack structure, the storage layer 73 (first magnetic layer) having variable magnetization, the reference layer 29 (second magnetic layer) having fixed magnetization, the tunnel barrier layer 72 (non-magnetic layer) provided between the storage layer 73 and the reference layer 29 are included. Further, in the stack structure, the shift cancelling layer 28 (third magnetic layer) for cancelling a magnetic field applied from the reference layer 29 to the storage layer 73 is included.

As described above, also in the present embodiment, after the lower structure of the stack structure is formed by IBE, the upper structure of the stack structure is formed by IBE in a manner similar to that of the first embodiment. Therefore, it is possible to form the stack structure only by IBE, and thus an effect similar to that produced by the first embodiment can be obtained.

Further, also in the present embodiment, by the overetching process of FIG. 32, the upper corner of the lower structure 20j and the portion adjacent to the upper corner are removed in a manner similar to that of the first embodiment. Therefore, it is possible to prevent the concentration of a magnetic field in the upper corner of the lower structure 20j, and thus an effect similar to that produced by the first embodiment can be obtained.

Next, a modified example of the present embodiment will be described. Note that, since basic points are similar to those of the above-described embodiment, points described in the above embodiment are omitted.

FIG. 34 is an exemplary sectional view of a part of a manufacturing method of the magnetic memory device of the modified example of the present embodiment.

In the present modified example, a predetermined ion is implanted in the upper corner of the lower structure 20i and a portion adjacent to the upper corner in a manner similar to that of the first modified example of the first embodiment. More specifically, after the process of FIG. 31 in the above-described embodiment, a predetermined ion is implanted in a portion of the lower structure 20i located outside the upper structure 70a by using the upper structure 70a as a mask. By doing this, an ion implantation region 29a is formed in the upper corner of the lower structure 20*i* and the portion adjacent to the upper corner. The predetermined ion is similar to that of the first embodiment.

Also in the present modified example, the ion implantation region 29*a* is magnetically deactivated in a manner similar to that of the first modified example of the first embodiment. Therefore, it is possible to prevent the concentration of a magnetic field in the upper corner of the lower structure 20*i*, and thus an effect similar to that produced by the first modified example of the first embodiment can be obtained.

FIG. 35 is a view schematically showing a general structure of a semiconductor integrated circuit device in which a magnetoresistive effect element (MTJ element) is employed.

A buried gate type MOS transistor TR is formed in a semiconductor substrate SUB. A gate electrode of the MOS transistor TR is used as a word line WL. A bottom electrode BEC is connected to one of source/drain regions S/D of the MOS transistor TR, and a source line contact SC is connected to the other of the source/drain regions S/D.

A magnetoresistive effect element MTJ is formed on the bottom electrode BEC, and a top electrode TEC is formed on the magnetoresistive effect element MTJ. A bit line BL is connected to the top electrode TEC. A source line SL is connected to the source line contact SC.

An excellent semiconductor integrated circuit device can be obtained by applying the structure and the method described in each of the above embodiments to the semiconductor integrated circuit device shown in FIG. 35.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising a stack structure formed of a plurality of layers including a magnetic layer, the device comprising:
    a lower structure of the stack structure, the lower structure including at least one layer; and
    an upper structure of the stack structure, the upper structure being formed on the lower structure and including at least one layer,
    wherein:
    the lower structure includes a portion located outside the upper structure when viewed from a direction parallel to a stack direction of the stack structure,
    an upper corner portion of the lower structure has a concave shape, and
    a center of the upper structure is shifted from a center of the lower structure when viewed from the direction parallel to the stack direction of the stack structure.

2. The device of claim 1, wherein the stack structure includes a first magnetic layer having variable magnetization, a second magnetic layer having fixed magnetization, and a non-magnetic layer provided between the first magnetic layer and the second magnetic layer.

3. The device of claim 2, wherein the stack structure further includes a third magnetic layer for cancelling a magnetic field applied from the second magnetic layer to the first magnetic layer.

4. A magnetic memory device comprising a stack structure formed of a plurality of layers, the device comprising:
    a lower structure of the stack structure, the lower structure comprising at least one layer, the lower structure including a magnetic layer; and
    an upper structure of the stack structure, the upper structure being formed on the lower structure and comprising at least one layer, wherein:
    the lower structure includes a portion located outside the upper structure when viewed from a direction parallel to a stack direction of the stack structure,
    an upper corner portion of the lower structure has a concave shape, and
    a center of the upper structure is shifted from a center of the lower structure when viewed from the direction parallel to the stack direction of the stack structure.

5. The device of claim 4, wherein the lower structure comprises a plurality of layers, including the magnetic layer.

6. The device of claim 4, wherein the stack structure includes a first magnetic layer having variable magnetization, a second magnetic layer having fixed magnetization, and a non-magnetic layer provided between the first magnetic layer and the second magnetic layer.

7. The device of claim 6, wherein the stack structure further includes a third magnetic layer for cancelling a magnetic field applied from the second magnetic layer to the first magnetic layer.

8. A magnetic memory device comprising a stack structure formed of a plurality of layers including a magnetic layer, the device comprising:
    a lower structure of the stack structure, the lower structure including at least one layer; and
    an upper structure of the stack structure, the upper structure being formed on the lower structure and including at least one layer,
    wherein:
    the lower structure includes a portion located outside the upper structure when viewed from a direction parallel to a stack direction of the stack structure,
    the lower structure includes a first portion which includes an upper corner of the lower structure and a portion adjacent to the upper corner, and a second portion which includes a portion of the lower structure excluding the first portion,
    a predetermined ion is contained in the first portion,
    a concentration of the predetermined ion in the first portion is higher than that in the second portion, and
    a center of the upper structure is shifted from a center of the lower structure when viewed from the direction parallel to the stack direction of the stack structure.

9. The device of claim 8, wherein a portion of the lower structure in which the ion is implanted is magnetically deactivated.

10. The device of claim 8, wherein the predetermined ion is selected from an inert gas ion, a silicon (Si) ion, a phosphorus (P) ion, a boron (B) ion, and a nitrogen (N) ion.

11. The device of claim 8, wherein the stack structure includes a first magnetic layer having variable magnetization, a second magnetic layer having fixed magnetization, and a non-magnetic layer provided between the first magnetic layer and the second magnetic layer.

12. The device of claim 11, wherein the stack structure further includes a third magnetic layer for cancelling a magnetic field applied from the second magnetic layer to the first magnetic layer.

* * * * *